Figure 1:
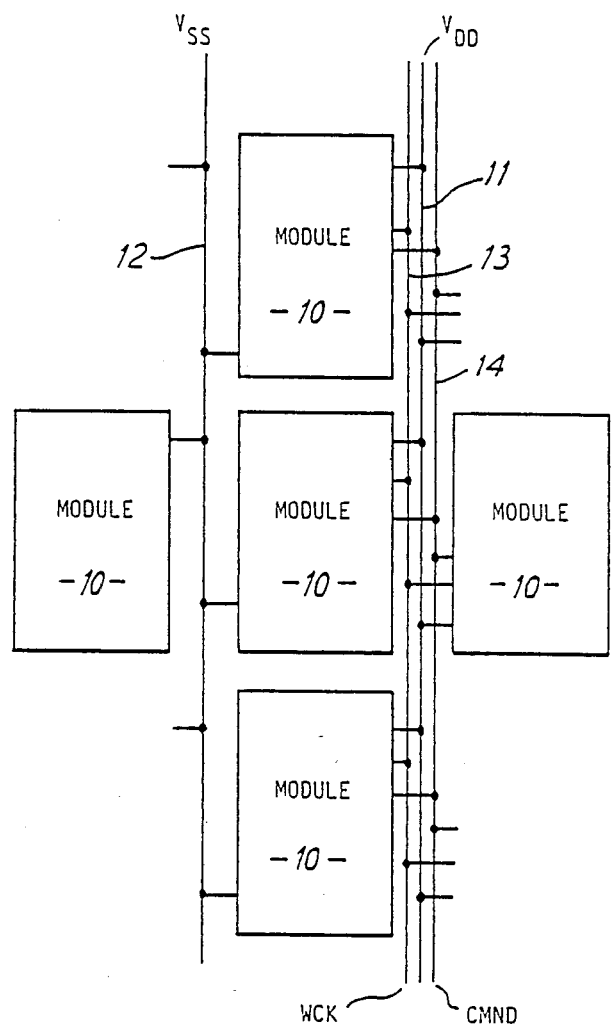

United States Patent [19]

McDonald

[11] Patent Number: 4,847,615
[45] Date of Patent: Jul. 11, 1989

[54] CONTROL SYSTEM FOR CHAINED CIRCUIT MODULES

[75] Inventor: Neal McDonald, Haddenham, England

[73] Assignee: Anamartic Limited, Cambridge, United Kingdom

[21] Appl. No.: 82,634

[22] PCT Filed: Oct. 6, 1986

[86] PCT No.: PCT/GB86/00601
§ 371 Date: Aug. 13, 1987
§ 102(e) Date: Aug. 13, 1987

[87] PCT Pub. No.: WO87/02487
PCT Pub. Date: Apr. 23, 1987

[30] Foreign Application Priority Data

Oct. 14, 1985 [GB] United Kingdom ............... 8525246

[51] Int. Cl.⁴ .................. H04Q 1/00; G06F 11/20
[52] U.S. Cl. .............. 340/825.020; 340/825.830; 371/11
[58] Field of Search .......... 340/825.02, 825.83, 340/825.86, 825.87; 370/58, 60; 371/11, 15; 364/465, 488, 490, 491; 382/41; 357/45; 307/465

[56] References Cited

U.S. PATENT DOCUMENTS

| | | | |
|---|---|---|---|
| 4,032,893 | 6/1977 | Moran | 340/825.87 |
| 4,517,659 | 5/1985 | Chamberlain | 340/825.86 |
| 4,700,187 | 10/1987 | Furtek | 340/825.83 |
| 4,722,084 | 1/1988 | Morton | 371/11 |

FOREIGN PATENT DOCUMENTS 0080834 6/1983 European Pat. Off. .
WO8302193 6/1983 World Int. Prop. O. .

OTHER PUBLICATIONS

Manning, Frank B. "An Approach to Highly Integrated, Computer-Maintained Cellular Arrays" *IEEE Transactions on Computers*, Jun. 1977, pp. 536-552.

*Primary Examiner*—Donald J. Yusko
*Attorney, Agent, or Firm*—Robert F. O'Connell

[57] ABSTRACT

A wafer-scale integrated circuit comprises a few hundred modules which can be connected into a long chain by commands sent from a terminal XMIT to the modules along a transmit path set up by way of module inputs from neighbouring modules and outputs thereto, only one of which is enabled by one of four selection signals. The transmit path normally follows a route through a main chain of modules M0 to M15, as shown by a full line. However, commands may be sent to nodal modules M0, M6 and M10 to make a alternative direction selections thereat, so as to obtain access to modules M16 etc in spur chains. Commands are addressed to the modules in accordance with their distances F from XMIT. Spurs may themselves include nodal modules such as M17. The normal and alternative direction selections are listed in a stored table which is used by a command unit to access any desired module and then restore the main chain M0-M15. In an alternative embodiment, the stored table lists individually for every module the sequence of direction selections needed to obtain access thereto by the shortest route avoiding unusable modules (marked with a cross).

11 Claims, 16 Drawing Sheets

CONTROL SYSTEM FOR CHAINED CIRCUIT MODULES

The present invention relates to a control system for chained circuit modules. It is known to connect a plurality of circuit modules in a chain, each module being capable of performing some memory and/or data processing operation. In particular, the circuit modules may be undiced chip areas of an integrated circuit wafer and the chain of modules may be grown by actuation of electronic switching functions within the modules, as described in GB No. 1 377 859. The growth process involves testing each newly added module and a chain of a few hundred modules may take some tens of seconds to grow. It has already been proposed in GB No. 2 114 782 to store the sequence of commands necessary to set up a chain of good modules, preferably permanently in a PROM, and (after the initial growth with testing process) to set up the chain rapidly in accordance with the stored commands, whenever the device is switched on. Although this reference recognizes the desirability of keeping the control logic of a module simple, it describes circuits of considerable complexity, for reasons explained below.

A module may be regarded as composed of a function unit, which performs the memory or data processing operation proper of the unit, and the logic which responds to commands. If the control logic is complex it uses up a lot of chip area which cannot be used for the function unit. Moreover, an important consideration in the case of chained modules is the integrity of the chaining paths between modules. These include part of the control logic of each module and this part will be called the serial logic. The control logic will additionally include side-chain logic, that is to say logic which is branched off the path through which the modules are chained. Any defect in the serial logic of a module will break the chain and render the apparatus inoperable. Particularly when the modules are undiced chip area, i.e. parts of a wafer scale integration (WSI) system, there is a high premium on keeping the control logic as simple as possible. As is well known, a significant problem in WSI is avoidance of faulty modules. It is advantageous to be able to utilise the control logic (or at least the serial logic) of a faulty module even though the function unit of the module is not used, and may even be disabled, because it is faulty. The use of good control logic of otherwise faulty modules makes it possible to grow chains more efficiently and include within the chain a higher proportion of non-faulty modules than if the chain excludes a module which is in any way faulty, (which is the approach adopted in GB No. 1 377 859).

Nevertheless there will inevitably be some modules which are completely unusable and, when an unusable module is encountered, it is necesasry in GB No. 1 377 859 to retract the chain to a greater or lesser extent and try another growth pattefn. This tends to leave behind short chains of good but unused modules, referred to herein as a spur of orphan modules. This problem is recognised in GB No. 2 114 782 and the solution there proposed is to allow the chain to branch so that a short chain which would otherwise have to be abandoned remains used, even although a new growth is commenced from the root of the short chain. Although the chain is said to branch, and does so in relation to the growth pattern of included modules, the data path through the modules is continuous as it is a double path which, when it leaves a module to pass to another module on an outbound path eventually returns from the other module to one module on an inbound path. The control logic necessarily involved in setting up routes for the double path which may leave and return across up to four sides of a module is unavoidably complex. Moreover the system proposed in GB No. 2 114 782 uses associative addressing of commands to the modules and each interface between adjacent modules is crossed by no less than 22 lines, of which only two are involved in the end purpose of the device (passage of data to and from the function unit). Apart from these numerous inter-module connections, the reference requires global power and clock lines, and two global command lines routed to all modules in parallel. Such a complex pattern of connections is bound to have a seriously detrimental effect on yield. As already noted, the control logic is also very complex.

Another complex system is described in "An Approach to Highly-Integrated, Computer Maintained Cellular Arrays" F B Manning, IEEE Transactions on Computers Vol C-26 No 6 June 1977 pp 536 to 552. This system uses a tree connection whereby commands flow out to all cells or modules in the tree. The commands are said to be broadcast and associative addressing is therefore essential and the control logic is necessarily complex.

A very much simpler form of control logic has already been proposed in the present assignee's British patent application No. 8517699 published as GB No. 2,177,825. In this reference only a single global command is needed (in addition to clock and power lines) and the inter-module connections are only four across each interface, allowing the outboard data path to enter or leave through that interface and the inbound data path correspondingly to leave or enter through that interface.

Although the present invention is not restricted to use of the system of GB No. 2,177,825, it is the object of the invention to provide a system which enables orphan modules to be avoided even although the control logic of each module is very simple.

It is a further object to make it possible to avoid orphan modules even when each module can have only one active entry point and one active exit point (precluding a branching chain).

Another problem with known systems is that the chain of modules is very long if full use is made of the available area of a wafer. Average access time along the chain in a given module is therefore long. Access is particularly inefficient if repeated accesses have to be made to a module a long way down the chain. A subsidiary object of the invention is to enable this problem to be overcome.

According to the present invention there is provided a control system for an assembly of circuit modules connectible in a chain and each of which can execute a selected one of a repertoire of commands and includes configuration logic whereby that module can select one of a plurality of neighbouring modules as the next module in the chaining path, and wherein the repertoire of commands includes commands to the configuration logic for effecting the selection, and a command unit for sending commands along the chain to individual modules, the command unit including a store which stores a plurality of sequences of commands for selectively setting a up a plurality of different chains terminating at different modules. Although the store may be a PROM (or even a masked ROM), it may be a RAM, possibly a non-volatile RAM. The data for the store may be held in a medium such as magnetic disc.

The chains may comprise a long main chain and one or more shorter chains consisting of part of the main chain and one or more additional modules which would be orphan modules if only the main chain were to be employed. Each main chain module at which one or more additional modules branch off may be called a nodal module. Selection between chains requires configuration selection commands to be sent to just the nodal modules. The additional modules may be assigned to relatively infrequently used functions so that the device spends much of its time configured to the main chain.

According to a development of the invention, each chain provides a shortest path route to a different terminal module. In general, whenever access is required to a given module the appropriate chain has to be set up but thereafter rapid access to that module via a very short path is possible. The array of modules on a wafer is treated as an array with access to modules in accordance with displacements in two coordinate directions. This is in contrast to the prior art technique of growing a very long chain, commonly called a spiral because it tends to follow a spiral path through the array.

Figure 2:
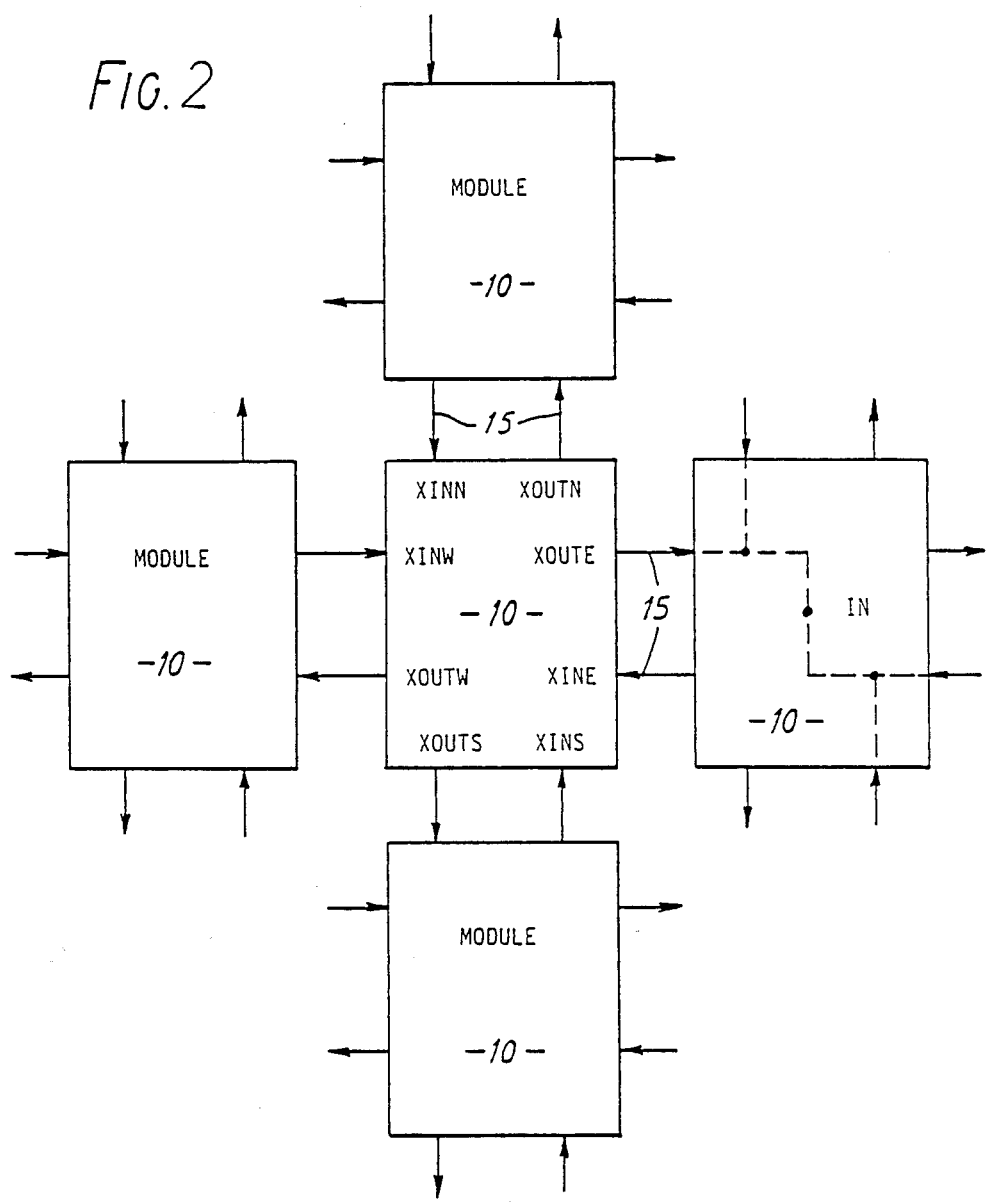
Figure 3:
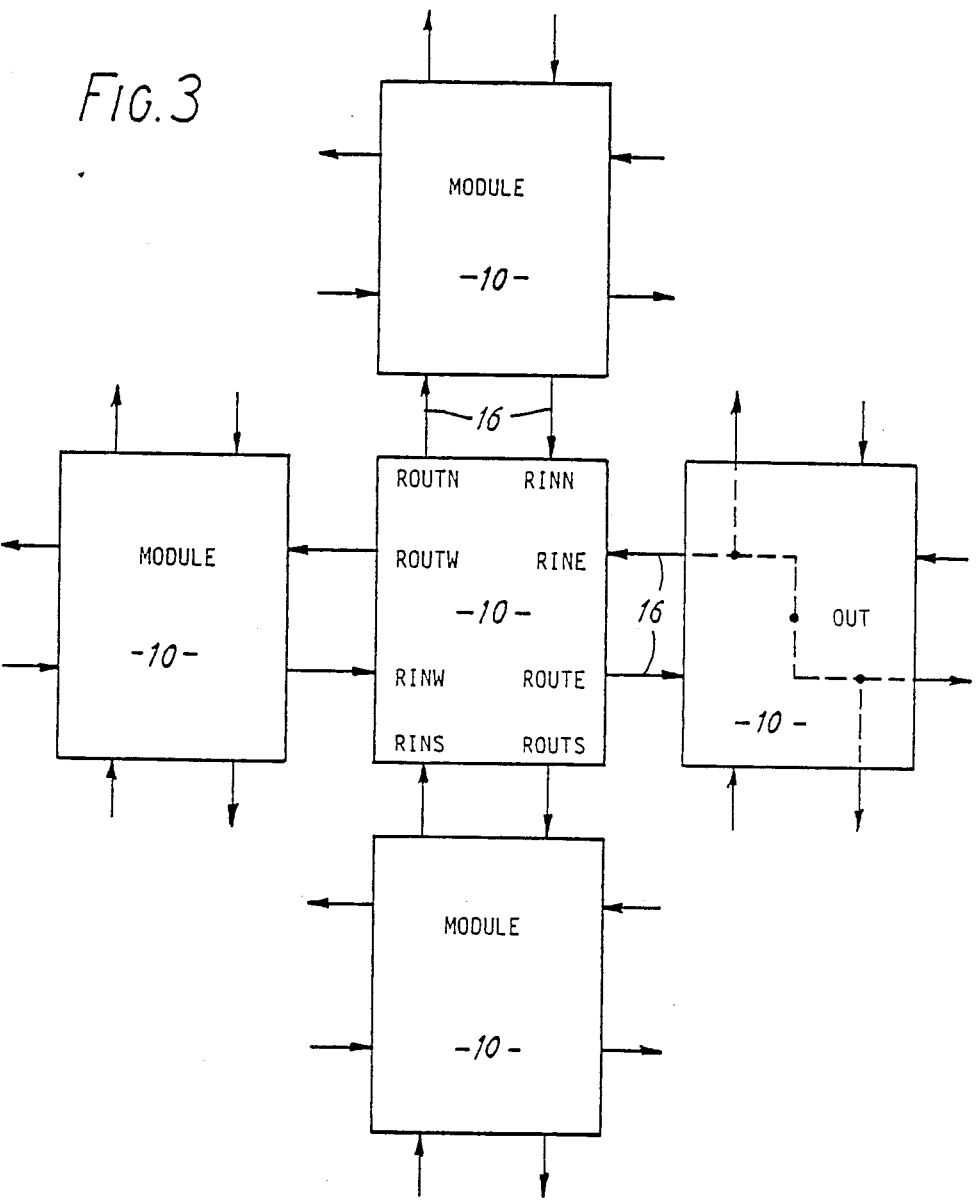
Figure 4:
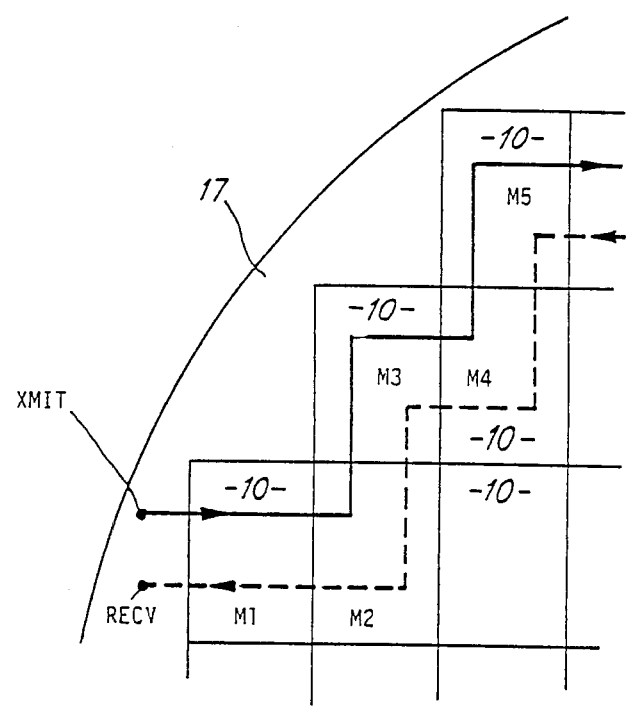
Figure 5:
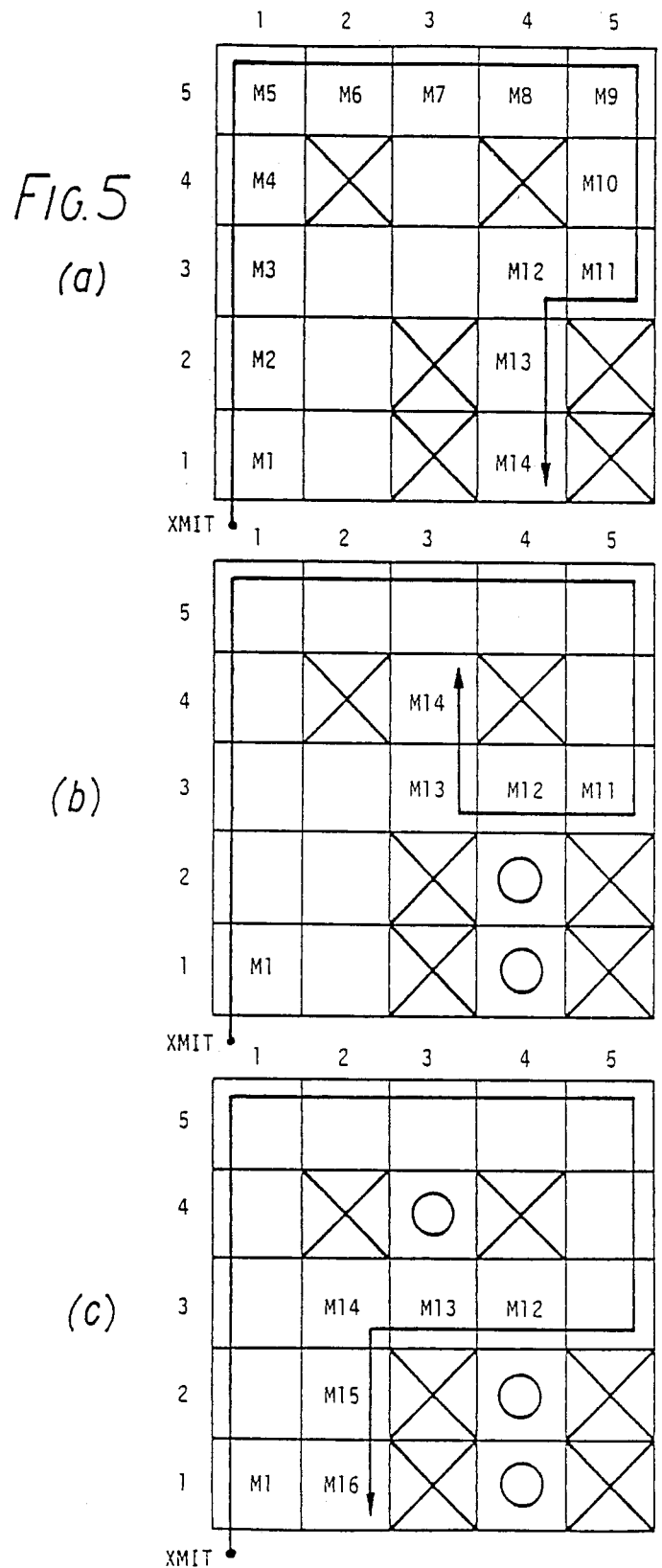
Figure 6:
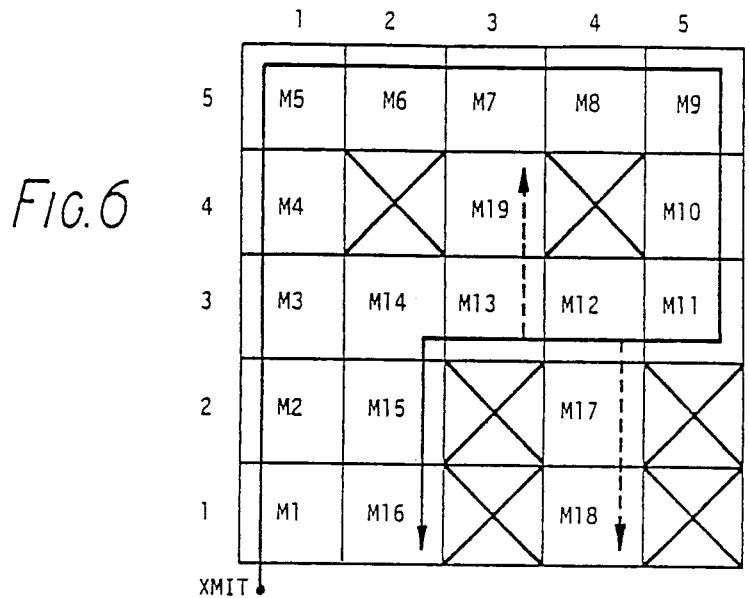
Figure 7:
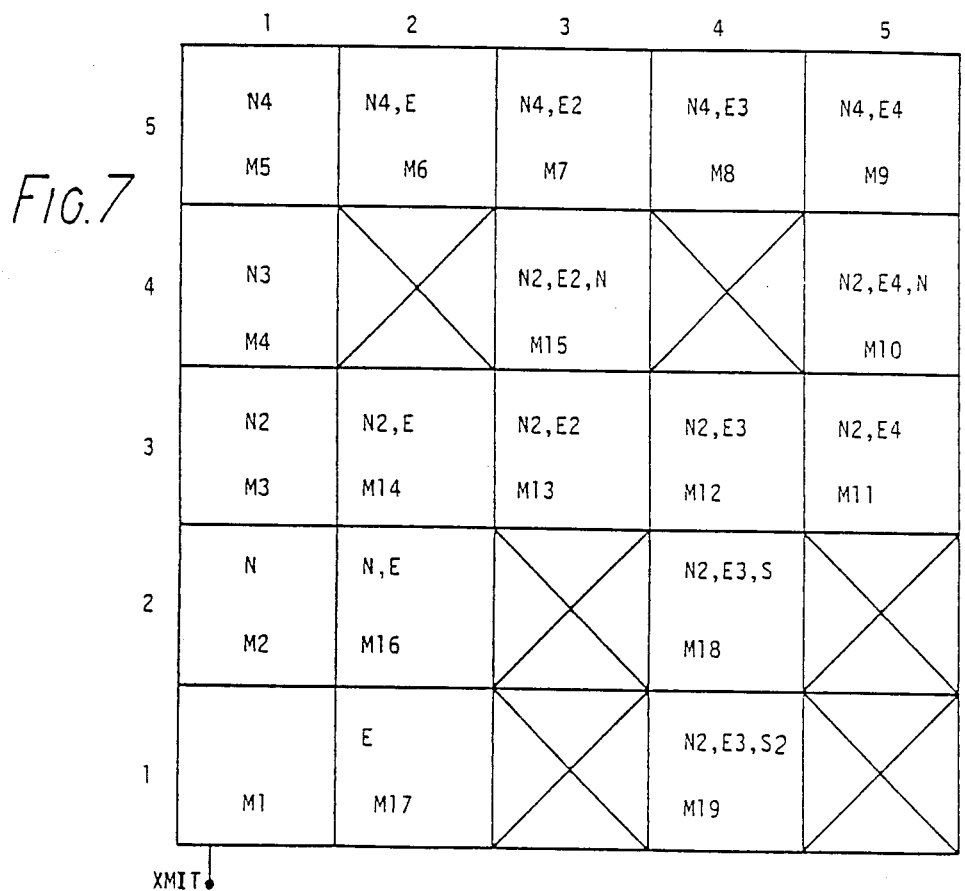
Figure 8:
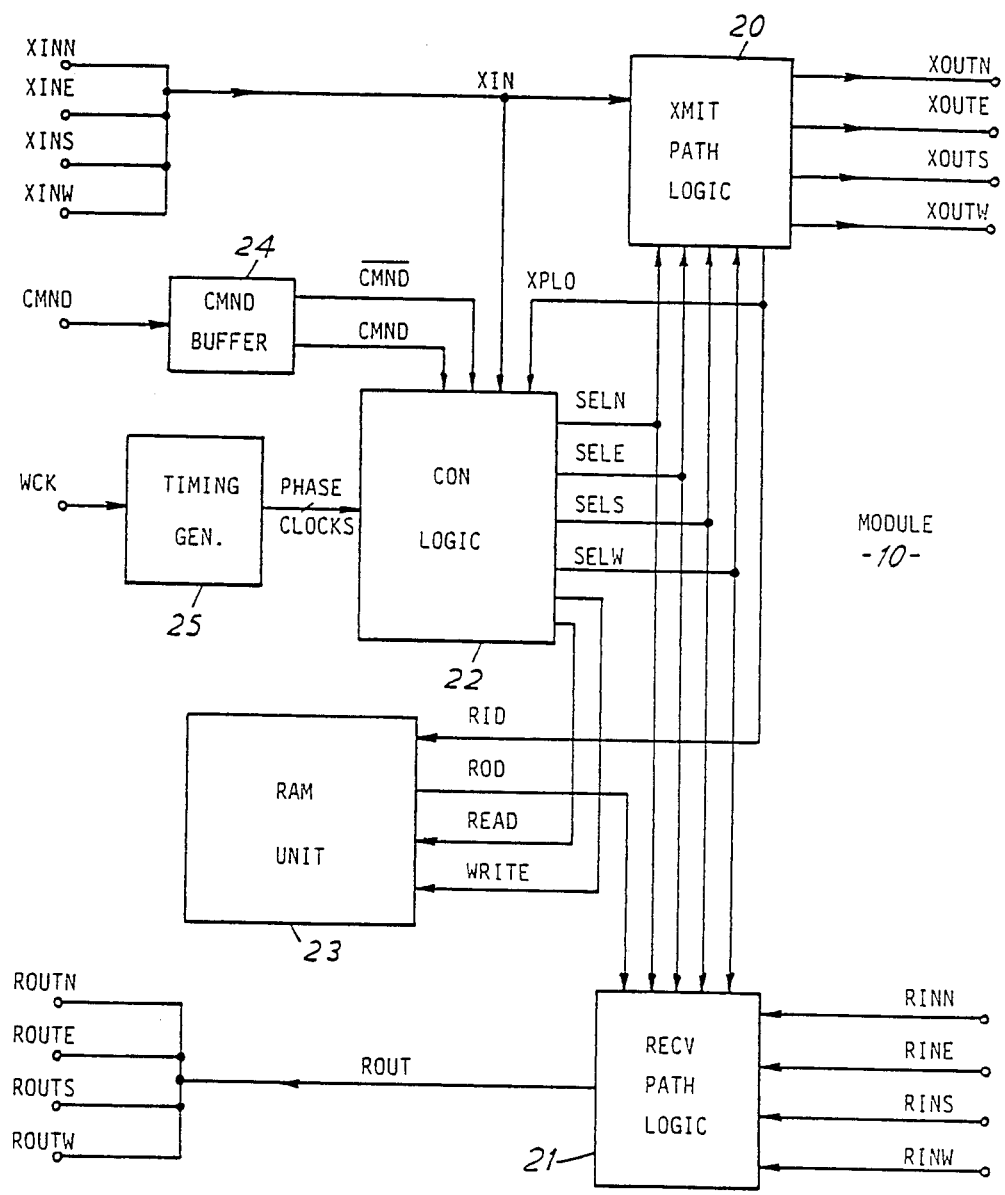
Figure 9:
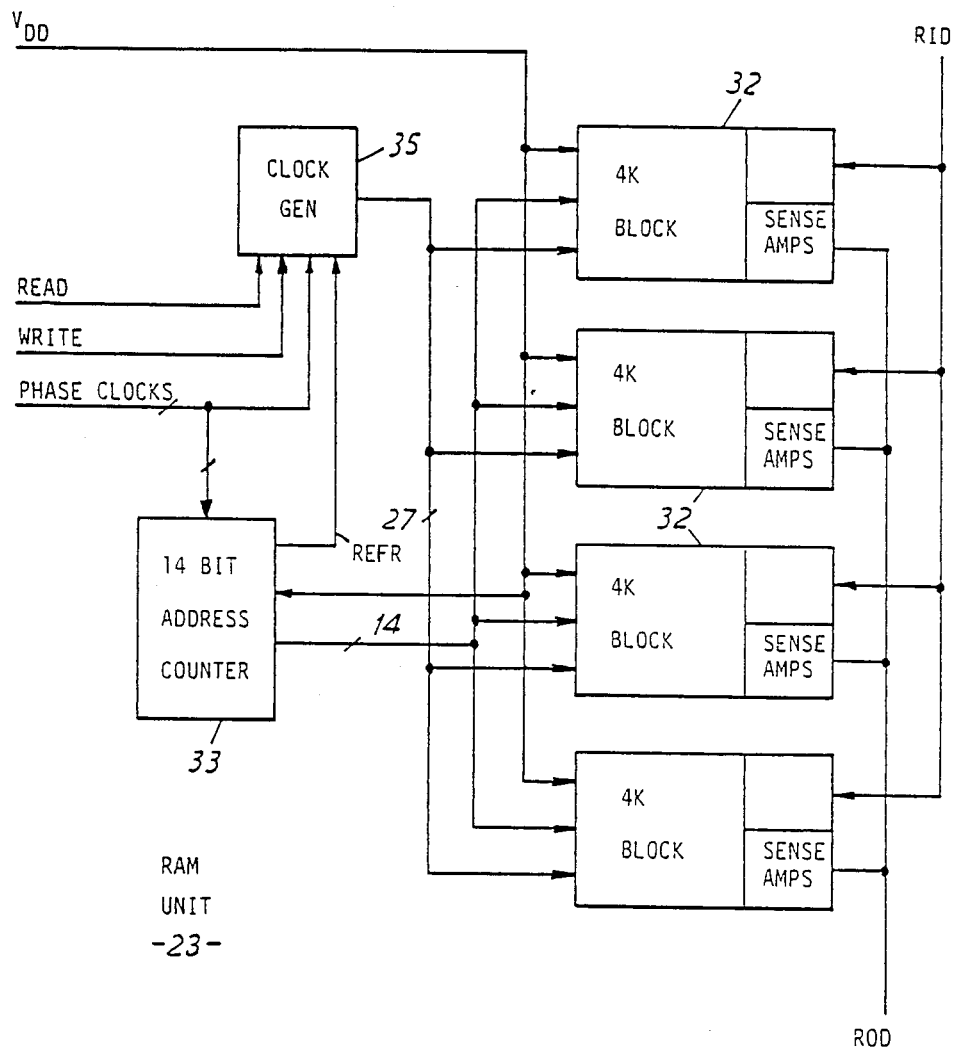
Figure 10:
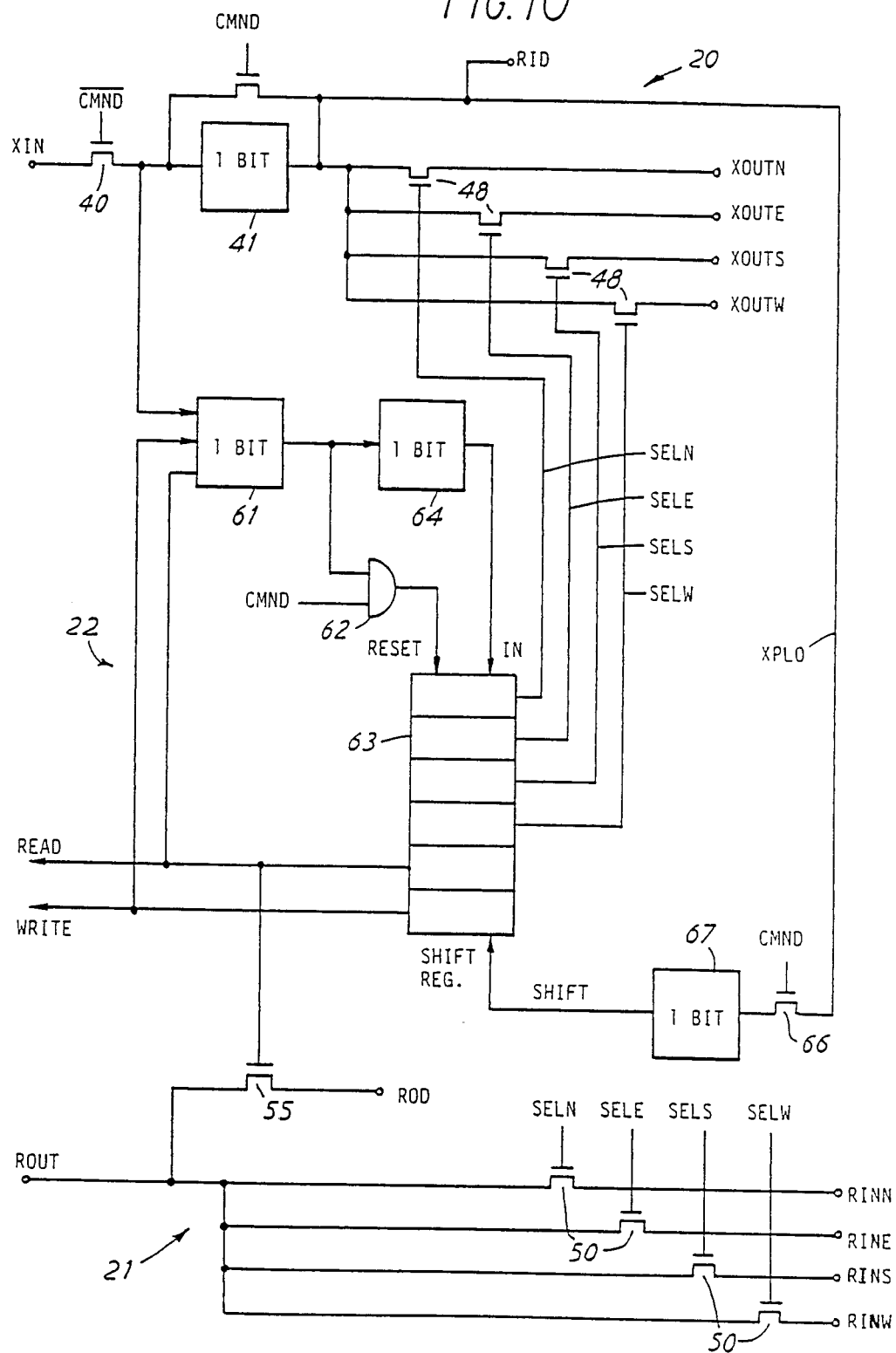
Figure 11:
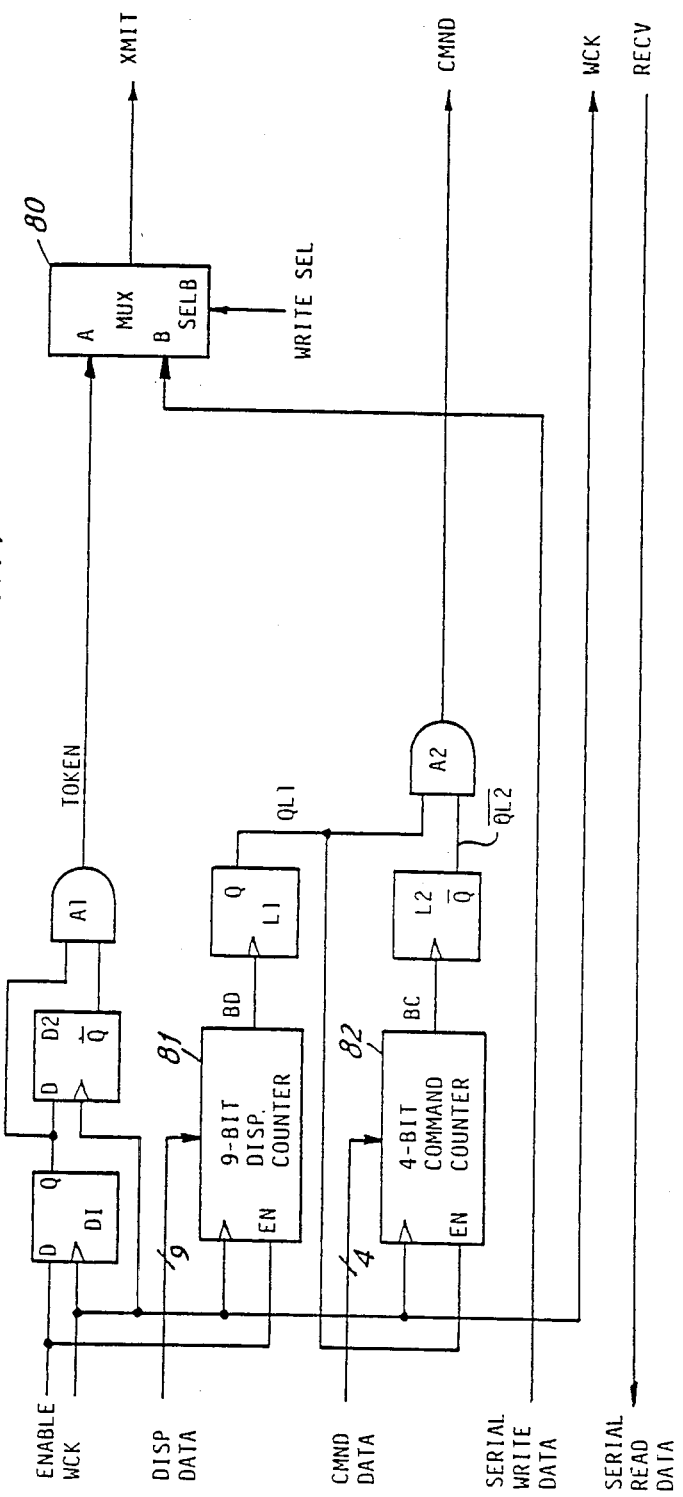
Figure 12:
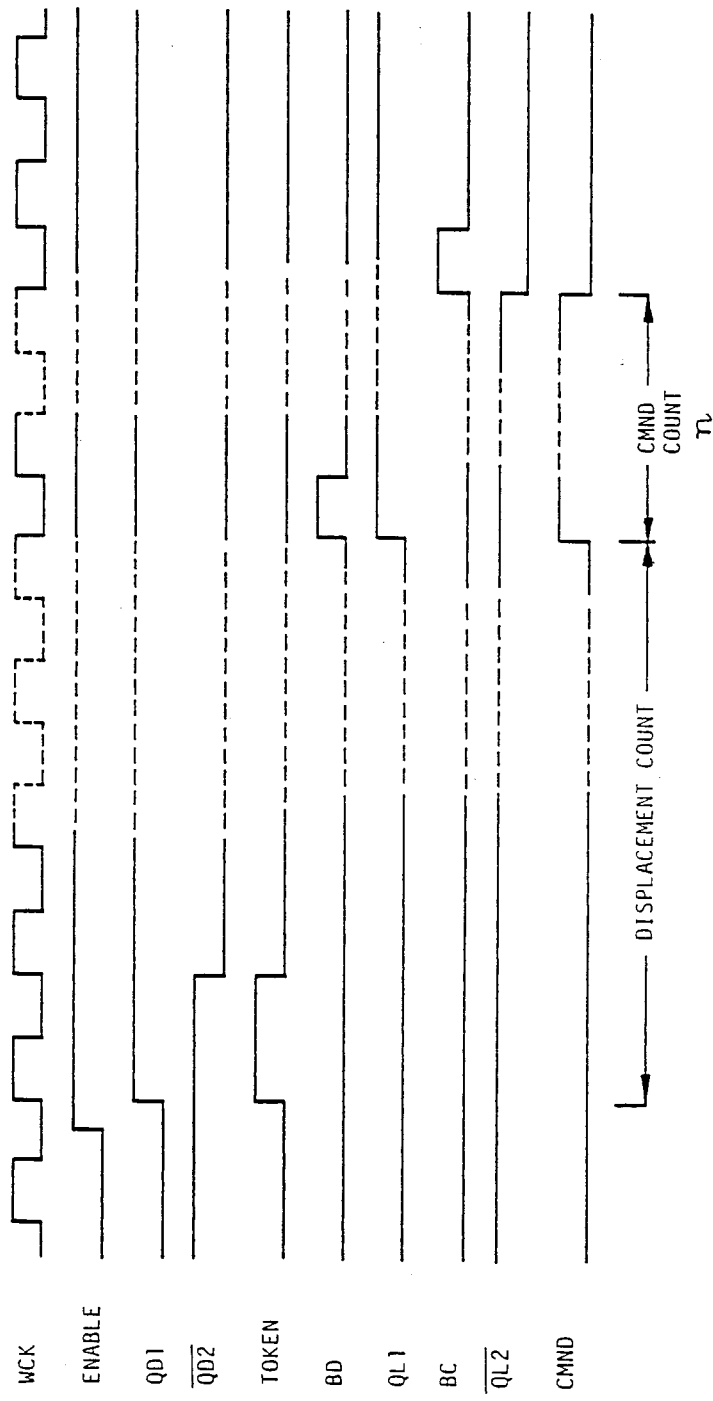
Figure 13:
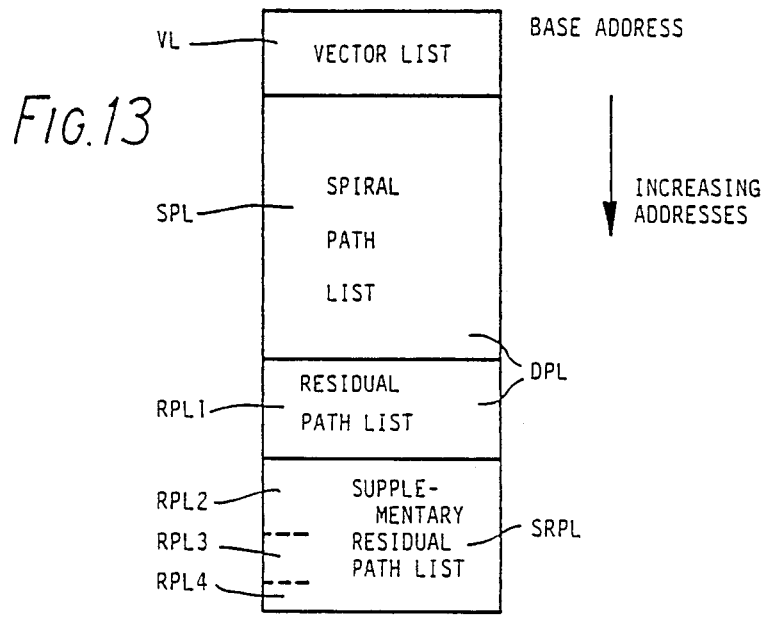
Figure 14:
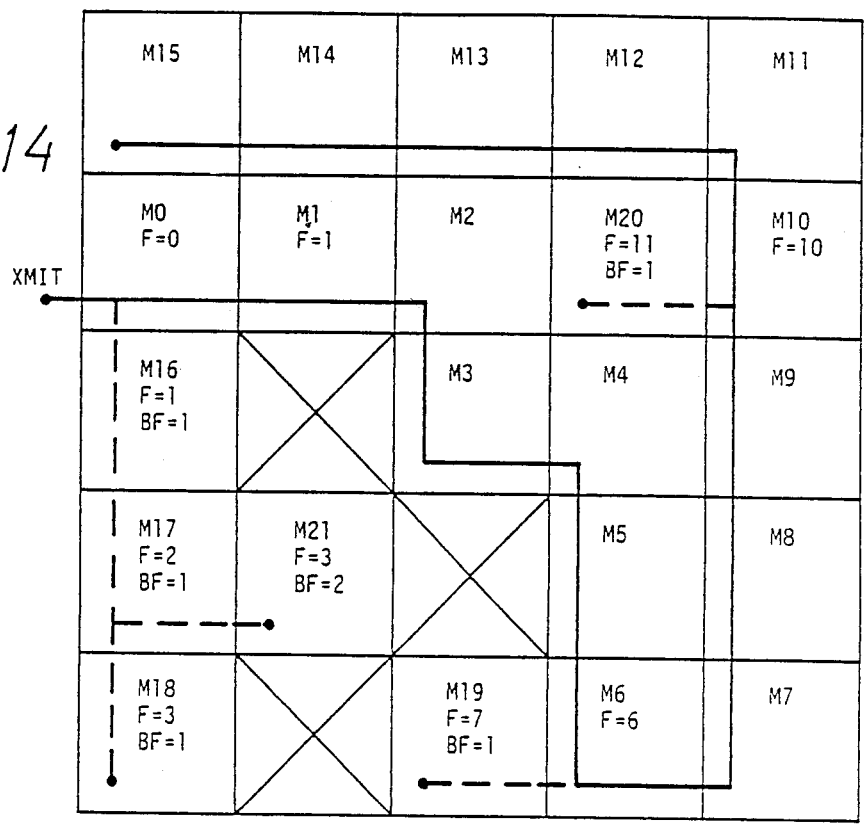

The invention will be described in more detail, by way of example, with reference to the accompanying drawings:

FIG. 1 shows part of a WSI circuit including global lines,

FIG. 2 shows part of a WSI circuit but shows the transmit path inter-module lines, FIG. 3 is similar to FIG. 2 but shows the receive path intermodule lines, FIG. 4 illustrates how a chain of modules is formed at the edge of a wafer, FIGS. 5 a-c illustrate how modules can become orphans, FIG. 6 illustrates use of a main chain and a subsidiary chain, FIG. 7 illustrates the use of short chains when modules are treated as an array, FIG. 8 is a general block diagram of a module, FIG. 9 is a block diagram of a memory unit forming the function unit of a module, FIG. 10 is a circuit diagrams of the transmit and receive path logic and the configuration logic of a module, FIG. 11 is a block diagram of a circuit for sending commands to modules, FIG. 12 shows explantory waveforms pertaining to FIG. 11, FIG. 13 illustrates the structure of a control PROM, FIG. 14 is a figure similar to FIG. 6 used in explaining how the contents of the PROM are determined, FIG. 15 shows the start of the PROM in more detail, FIGS. 16 to 19 show some flow diagrams used in explaining how the contents of the PROM are employed.

For convenience the embodiment to be described utilizes the addressing technique of GB No. 2,177,825 but with some simplifications. Further details will be found in the specification of our prior application.

FIG. 1 shows a few modules 10 on a wafer. There may be a few hundred modules on the wafer. The modules are set in a grid of global lines, namely a $V_{DD}$ power line 11, a $V_{SS}$ power line 12, a WCK (wafer clock) line 13 and a CMND (command) line 14. All these lines go to bondsites on the edge of the wafer or WCK and CMND may go to a command modules on the wafer.

FIG. 2 shows the same modules 10 minus the global lines but with inter-module lines 15 for transmit paths. Data may be sent through a chain of modules, starting at a bondsite identified as XMIT (transmit; not shown). The modules have four connections into their XMIT path and these connections are identified as follows:

XINN from module above
XINE from module to right
XINS from module below
XINW from module to left.

As shown in the right hand module only, these XIN lines merge into a single XIN terminal.

The modules have found connections out from their XMIT paths and these connections are identified as follows:

XOUTN to module above
XOUTE to module to right
XOUTS to module below
XOUTW to module to left.

Unlike the XIN lines, these output lines are switched so that a module can select only one of its edge neighbours as the next module in the chain, on to which XMIT data is passed.

The modules are also connected by receive path inter-module lines 16 (FIG. 3) which allow data to be sent back to a bondsite identified as RECV (not shown).

The modules have four connections into their RECV paths:

RINN from module above
RINE from module to right
RINS from module below
RINW from module to left.

These connections are switched in correspondence with XOUT connections.

The modules have four connections out of their RECV paths:

ROUTN to module above
ROUTE to module to right
ROUTS to module below
ROUTW to module to left.

These connections branch, without switching, from an OUT terminal, so that return data is broadcast to all four neighbours, only one of which will have been set up to receive it.

The XOUT and RIN selections are effected by four selection signals SELN, SELE, SELS and SELW, whose generation is explained below. Only one of these signals can be true. If SELN is true, for example, the module routes the XMIT pth to the adjacent module above the accepts RECV data from that module.

The SEL signals of the modules may be set up basically as described in GB No. 1 377 859. Modules are added one by one to the chain, tested and retained if good, and the procedure is reiterated to grow a chain of interconnected modules. The chain tends to spiral in to the centre of the wafer in the case of a peripheral bondsite for XMIT and RECV. There may be a plurality of such bondsites, say four, to improve the chance of finding a good place to start the chain.

FIG. 4 illustrates a peripheral fragment 17 of a wafter with modules 10 and the bondsite terminals XMIT and RECV. Portions of the XMIT path and RECV path are shown in full and broken lines respectively, as they would be grown through modules in accordance with the algorithm that each module tries its selection options in the order SELN, SELE, SELS and SELW. The first module M1 fails with SELN (there is no module above it) but succeeds with SELE, so adding M2 to the chain. M2 succeeds with SELN and adds M3. M3 fails with SELN but succeeds with SELE, to add M4. M5 succeeds with SELN to add M5, and so on. In the example shown all modules are good, at least so far as their control logic is concerned.

Problems and principles underlying the present invention will now be explained with reference to FIGS. 5 and 6 which show various simplified diagrams based on 5×5 arrays of twenty-five modules 10. For further simplicity, only the outbound data path from XMIT is shown with the understanding that it is paralleled by a return path to RECV. The labels M1, M2 etc are used to denote the modules in order along the chain. A large proportion (six out of twenty-five) of the modules are assumed to be unusable and these modules are marked by a cross. It is assumed that the growth algorithm is the simple "spiral" algorithm explained above in connection with FIG. 4.

The modules may also be identified by their position in the array using the marginal row and column numbers shown on the drawings. Thus, in FIG. 5(a), for example, module M1 in the chain is module M(1,1) in the array, M2 in the chain is M(2,1) in the array, and so on.

FIG. 5 shows the chain M1 to M14 which grows initially under straightforward application of the spiral algorithm. The chain has terminated in a dead end and, in order to effect further growth, has to retract firstly by dropping M14 and trying for a new growth direction from M13. There is none so M13 has also to be dropped to enable growth to carry on from M12.

Although modules M(1,4) and M(2,4) are perfectly good, they have had to be abandoned and become orphans marked with an 0 in FIG. 5(b). Moreover, when growth has proceed to a new M14=M(4,3) the chain is again at a dead end. M(5,3) is unavailable as it is already in the chain and the growth algorithm keeps a record of all modules in the chain and avoids trying to use the same module twice. A further retraction is necessary and the final growth pattern is as in FIG. 5(c).

The chain is sixteen modules long. In addition to the six defective modules, three modules have been lost as orphans in two spurs. Although the example is somewhat artificial because it is restricted to such a small array, it illustrates quite clearly how the simple spiral algorithm fails to achieve potential yield because it leaves behind spurs of orphan modules.

FIG. 6 illustrates the principal of a first embodiment of the invention. In addition to the main chain or spiral M1 to M16, it is possible to access two shorter chains or spirals M1 ... M11, M12, M17, M18 and M1 ... M12, M13, M19 where M17, M18 are in a firt short spur and M19 constitutes a second short spur. The main chain is shown in full lines and the spurs in dotted lines to illustrate the point tht only one chain exits at a time; each module can only support one active output connection. The modules M12 and M13 are "nodal modules" whose SEL directions have to be be switched to select between the different spirals. As will be explained below, the routing necessary to access a module in a spur can be stored (in a PROM for example). It may be desirable to consider the main spiral (M1 to M16 in FIG. 6) to represent the normal configuration which is re-assumed after any access to a spur. The overhead in reconfiguring to access spurs is not excessive considering that they will account for only a small proportion of modules. Moreover, it may be arranged to allocate rarely used data to spur. Although not illustrated, it will be appreciated that the principle can be extended to access spurs off spurs. This approach is capable of accessing all good modules except a good module which is surrounded by bad modules on all four sides.

FIG. 7 illustrates another embodiment of the invention in which no spiral chains are imposed. Rather, each module has its own access route which is symbolized by a listing of the SEL commands necessary to reach that module. The good modules are assigned arbitrary module numbers M1 to M19. The legend N2, E3, S in M18 means that the route thereto is specified by:

SELN (M1 or M2)
SELN (to M3)
SELE (to M14)
SELE (to M13)
SELE (to M12)
SELS (to M18)

The way in which the embodiments of the invention are implemented will now be explained, starting with a description of a module 10. A module which is connected into an active chain normally acts as a link in the chain and outbound data and commands pass from XMIT through the XMIT path in the module with a 1-bit delay through each module. Inbound data returns to RECV through the RECV path in the module, also with a 1-bit delay through each module. Each module contains a 16 k×1 bit dynamic RAM unit which is constantly refreshed under control of a free-running address counter. The module also contains control logic which can respond to commands to effect SELN, SELE, SELS and SELW and to other commands of which the most important are READ and WRITE. When a module receives either of these commands, the chain is broken at that module and the RAM unit is written to in the case of WRITE and read from in the case of READ. Although the RAM unit is composed of random access blocks it is only addressed by the free running counter and treated as a 16 k block of serial memory. In a READ operation, all 16 k of the memory or part thereof is read out on to the RECV line. If the READ command is timed correctly in relation to the address counter cycle, the memory block will be read out correctly starting from address 0 and running through to address $(2^{16}-1)$. If the Read command is not thus timed, the data will be "wrapped round" - in an address order N, ..., $(2^{16}-1)$, 0, ..., (N−1) where N is the address obtaining at the READ command. The data can be accepted in this order at RECV and then cyclically shifted to establish the correct address order.

In a WRITE operation 16k of data is written from XMIT into the RAM unit. The command and ensuing data must either be correctly timed in relation to the address counter cycle or must be prewrapped-round to match the address N at which the write starts, or this address must be noted for use in any subsequent read operation.

It may be poreferred to wait and launch READ and WRITE commands at the correct times relative to the address counter cycles as the delay thereby incurred is less than the time taken to re-organize wrapped-round data by shifting.

Yet another possibility is to read the data without waiting and adjust the pointers into CPU RAM so as to unwrap the data in this way with no delay. Thus, if the data is handled in n-bit words, and the $2^{14}/n$ words are to go into locations T to $T+2^{14}/n-1$ in RAM, if reading commences at the $S^{th}$ word of the 16k block, the words may be written into locations.

[T+S], [T+S+1] ... [T+$2^{14}/n$−1],[T],[T+1] ... [T+S−1] by way of a bidirectional serial/parallel converter forming the interface between the RECV bit stream and the word-organized CPU RAM. However further buffering will be required in this converter to allow time for the address pointer to be adjusted from [T+$2^{14}/n$−1] to T.

After a read or a write operation, assuming that communication is then required to the subsequent modules, it is necessary to send the appropriate SEL command to the module to re-establish the chain. A more detailed description of a module will now be given with an explanation as to how the aforementioned facilities are provided and other features of the preferred embodiment.

FIG. 8 is a block diagram of one module. The four XIN terminals merge into XIN which forms the input to XMIT PATH LOGIC 20, within which the switching takes place to route the XMIT path to XOUTN, XOUTE, XOUTS or XOUTW. The four RIN terminals enter RECV PATH LOGIC 21 which selects one RIN terminals for connection to ROUT which branches to the four ROUT terminals.

XIN is also connected to CON LOGIC 22 (configuration logic) which decodes commands and provides the above-mentioned selection signals SELN, SELE etc and other commands, including READ and WRITE commands for a RAM UNIT 23. The command line CMND is fed to a clocked buffer 24 which provides complementary signals CMND (designating command mode) and CMND BAR (designating "transmit mode"). Basically, in transmit mode the module acts simply as a link in the chain passing on both outward bound XMIT path data and inward bound RECV path data. In command mode the module detects whether a command token is present in its XMIT path logic and, if it is, decodes and obeys the command addressed thereto, i.e. timed to provide a token bit in that module when CMND goes true.

CMND, CMND BAR and signals in general are gated with clock signals (described below) as is conventional in MOS circuits. For simplicity this design detail is ignored in the present description.

The function unit of the module is a 16K RAM UNIT 23. In the presence of WRITE, 16k of data from the XMIT PATH LOGIC 20 is written into the RAM UNT via a line RID (RAm input data). In the presence of READ, 16K of data is passed to the RECV PATH LOGIC 21 via a line ROD (RAM output data).

A timing pulse generator 25 provides multiphase timing signals PHASE CLOCKS in response to WCK. Although PHASE CLOCKS are shown connected only to CON LOGIC 22, they are of course distributed to the module circuits generally.

A module has seven mutually exclusive states as follows:
SELN asserted (link to module above)
SELE asserted (link to module to right)
SELS asserted (link to module below)
SELW asserted (link to module to left)
READ aserted
WRITE asserted
RESET (none of the above asserted).

As shown in FIG. 9, the RAM UNIT 23 includes four 4K RAM blocks 32 and a free-running, 14 bit address counter 33 ($2^{14}=16384$). The RAM data inputs are connected to the common input line RID (RAM input data) which accepts data from the XMIT PATH LOGIC. The RAM sense amplifiers 34 are connected to the common output line ROD (RAM output data) which passes data to the RECV PATH LOGIC.

The detailed management of the RAM's is effected conventionally by a clock generator 35 which receives the PHASE CLOCKS, READ and WRITE and effects precharge, discharge, refresh and so on, in a manner which need not be described here. The counter 33 comprises a 7-bit column counter (least significant half) and a 7-bit row counter (most significant half). Every time a carry propagates from the column counter to the row counter, a signal REFR is given to the clock generator 35 and the currently addressed row is refreshed in well known manner. Thus refresh takes place every 128 ($2^7$) clock pulses and a cycle of 128×128 clock pulses is required to refresh all rows of the RAM blocks 32.

FIG. 10 shows the XMIT PATH LOGIC 20. XIN is connected through an FET 40 enabled by CMND BAR to a clocked 1-bit stage 41, from which drive is provided to the XOUT lines. Each such line includes an FET 48 of which only one is enabled by the corresponding signal SELN, SELE, SELS or SELW.

When the module is merely being used as a link in the chain and CMND BAR is accordingly asserted, XIN is connected to one of XOUTN, XOUTE, XOUTS, XOUTW through FET 40, 1-bit stage 41, and whichever of the FETs 48 is enabled.

When the module is writing data to the RAM UNIT 23, CMND BAR is again asserted and the data passes through the FET 40 and 1-bit stage 41 to RID.

The output of the 1-bit stage 41 is fed back to the input of the stage through an FET 49 which is enabled by CMND to form a 1-bit latch which latches the bit therein at the time CMND is asserted. This output is XPLO (transmit path latch out), which is physically the same as RID. XPLO is what tells the CON LOGIC 22 whether the module in question is addressed or not when CMND is asserted.

FIG. 10 shows the RECV PATH LOGIC 21. RINN, RINE, RINS and RINW are connected through respective FET's 50 to ROUT. The FETs 50 are enabled by SELN, SELE, SELS and SELW respectively.

In order to transfer data from the RAM UNIT 23 to the RECV path, ROD is connected to ROUT through an FET 55 enabled by READ.

The CON LOGIC 22 will now be described. XIN is connected through the FET 40 enabled by CMND BAR to a 1-bit stage 61. WRITE and READ are also connected to the stage 61 which performs an OR function. The output of the 1-bit stage 61 is gated in an AND gate 62 with CMND to provide RESET.

The operation of this part of the circuit is as follows. If, in transmit mode, XIN provides a 1-bit it is buffered in the 1-bit stage 61. If CMND is asserted before the next clock pulse, the output of the AND gate 62 goes true to assert RESET.

The output of the 1-bit stage 61 is buffered or one more bit time by a stage 64 to provide a token bit which is a bit to be clocked down a shift register 63 so long as CMND is asserted. It should be noted that RESET can only be asserted and the token bit generated when (1) the transmit path latch 41 contains a 1-bit when CMND is asserted or (2) READ or WRITE is asserted when CMND is raised, irrespective of the contents of the transmit path latch. Case (1) represents the normal way of addressing a command to a module: asserting CMND at the time a 1-bit is present in the module on the XMIT path. Case (2) provides a means of aborting a WRITE or READ operation.

As explained above XPLO will be latched at 1 in an addressed chip. As shown in FIG. 10, XPLO is applied to a 1-bit stage 67 through an FET 66 enabled by CMND to provide SHIFT which enables the above-mentioned shift register 63 in order to clock the token bit along the register until CMND ceases to be asserted.

Detailed timing considerations are not entered into here but the general situation is that XPLO is one bit delayed relative to XIN and SHIFT is a further bit delayed relative to XPLO. RESET is one bit delayed relative to CMND and the token bit is a further bit delayed. RESET is thus generated off the same bit as is latched to form XPLO and one bit later, this same bit appears as the token bit to be clocked along the shift register with SHIFT true.

The shift register 63 may consist of a chain of six clocked D-type flip-flops. The flip-flops provide SELN, SELE, SELS, SELW, READ and WRITE respectively. Assuming that the module in question is addressed it can be seen that these six flip-flops will first be cleared by RESET. Then the token will be clocked from flip-flop to flip-flop for as long as SHIFT remains true. When SHIFT becomes false, which is when CMND goes false, the token bit is latched in whichever flip-flop it has reached.

If a 1-bit is sent down the XMIT path and CMND is asserted in the period in which that bit enters a given module and is then held true for $n$ clock periods, $n=2$ will cause the token to be latched in the first flip-flop (SELN), $n=3$ will cause the token to be latched in the second flip-flop (SELE) and so on.

Although a more sophisticated test procedure is described in our prior application, it is assumed here that the basic way in which the chain is grown is to address SELN to the module M(n), so as to open up to the module M(n+1) which is then tested by using WRITE followed by READ to see if it will successfully write a block of data and red it back. If the test fails, SELE is sent to M(n), the new M(N+1) is tested and so on.

FIG. 11 shows the control circuitry for controlling the addressing of the modules. This circuitry may be off the wafer and interfaces with a control processor (not shown) which provides the necessary data and a strobe signal ENABLE which initiates a command operation.

When ENABLE goes true (see also FIG. 12) it generates a 1-bit TOKEN via flip-flops D1 and D2, whose outputs QD1 and QD2 BAR are shown in FIG. 12, and an AND gate A1. The TOKEN is applied to XMIT via a multiplexer 80. ENABLE also enables (EN terminal) a 9-bit displacement counter A2 which is used to count the number of clock pulses to the module to be addressed. A 9-bit counter will handle a chain of up to 512 modules. The counter 81 will have been preset by the control processor with the correct initial value denoted DISPLACEMENT DATA and, when enabled, counts clock pulses WCK until a terminal count BD is reached. BD is latched in a latch L1 whose output QL1 enables a second counter 82 and also initiates CMND via an AND gate 82. The counter 82 is a 4-bit command counter preset in accordance with the desired duration of CMND by CMND DATA. When this counter reaches its terminal count BC a second latch L2 latches BC and the QL2 BAR output of this latch disables the gate A2, so terminating CMND. A 4-bit counter 82 suffices to set up all desired durations of CMND.

Although not illustrated, QL2 BAR may be used to reset the latches D1, D2, L1, L2 or a central reset mechanism can be used.

When a WRITE command is set up, the controlling processor must feed the serial data to XMIT after CMND has gone low again and in doing this it applies a signal WRITE SEL to the multiplexer 80 to connect SERIAL WRITE DATA to XMIT. When a READ command is set up, the controlling processor must be ready to accept serial read data from RECV $m$ clock pulses after the termination of CMND, where $m$ corresponds to the displacement of the addressed module from RECV.

A single TOKEN bit can beused to address a plurality of modules in sequence. The bit is latched in the latch 41, 42 (FIG. 10) and, when a command is terminated at one module, can continue to another module, which is addressed when CMND is asserted, provided the one module is in a state with one of its SEL signals asserted.

This may be achieved using "termination with onward addressing" (TOA). In the case of the WRITE operation, a '1' is appended to the end of the write data stream so that, when CMND is raised AT THE END of the write operation, the module performing the write sees a '1' in its XMIT path latch. The module is therefore once again an addressed module; raising CMND resets the shift register, so terminating the write operation and a new onward path from the module may then be selected, by keeping CMND high for the appropriate number of clock pulses. In the case of the READ operation, a similar scheme pertains, save that in this case the command token must be injected into the XMIT path at such a time that it arrives at the target chip when or after the last bit of data is being read out on to the RECV path.

It is clear that paths may be set up and read or write operations performed as required by sending, in sequence, appropriate values of DISPLACEMENT DATA pulse CMND DATA to the control circuit of FIG. 11. The form in which data is stored to enable each module to be accessed will now be explained for the two alternative approaches of FIGS. 6 and 7.

In the former alternative a PROM is used with a memory allocation as illustrated in FIG. 13. In order to match a conventional tabulation of data, FIG. 13 has the base address of the PROM at the top.

The PROM is blown only after the wafer has been fully tested. Starting at its base address, the PROM comprises a vector list VL, a spiral path list SPL, a residual path list RPL1 and a supplementary residual path list made up of blocks RPL2 to RPLn, illustrated with $n=4$. SPL and RPL1 together form the data path list DPL.

SPL lists all the modules in the main spiral. Each entry includes the following items:

D: a number (e.g. 3 bits) defining the direction in which the module normally links on to the next module in the main spiral. The values for D as follows:

1=SELN
2=SELE
3=SELS
4=SELW
0=END OF CHAIN

F: a number (e.g. 9 bits) defining the number of clock cycles distant from XMIT.

U: a single bit which is zero if the module has a usable function unit but is one if the function unit is unusable and the module is merely used as a link in the chain. See our prior application for more information as to the discriminations between modules on this basis.

R: a single bit which is zero for a module in the main spiral.

RPL1 is a continuation of SPL and lists all the modules which are not on the main spiral, with the R bit set to one. The way in which M numbers are allocated to modules in spurs will be explained below. FIG. 14 is a diagram similar to FIG. 6 with a main spiral in full lines and four spurs in broken lines, including a spur off a spur. However, the growth has been established using a different alogorithm; moreover the first module is numbered M0, instead of M1. Each module is inscribed with its M number, certain modules with their F numbers and spur modules with a BF number which specifies its branch factor, i.e. the number of branchings at nodal modules involved in reaching that module.

RPL2 lists information for all spur modules with BF=1 in M number order. The information consists of the F number for the nodal module which has to be switched to access the spur in question, the required D number and an R bit which is zero if the module is on the accessed spur (i.e. if BF=1) but is one if BF is greater than 1 and further branching is needed.

Similarly RPL3 lists information for all spur modules with BF=2, up to RPLn which lists information for all spur modules with BF=n−1. For the example of FIG. 14, the maximum value of BF is 3 and so the supplementary residual path lists are just RPL2 and RPL3.

In order that the various entires in SPL and RPL1 etc may be accessed correctly, the vector list VL is set up as shown in FIG. 15 which represents the top part of FIG. 13 in more detail. The first entry in this block is a check sum, namely the complemented contents of the data in VL, DPL and SRPL. CHK.SUM is formed when the PROM is blown and enables the reliability of the contents of the PROM to be checked at any time. A total sum of all the contents of all addresses, including CHK.SUM should equal zero. For these purposes, each PROM address is treated as a single word (which must be at least 14 bits to cater for F, D, R and U in the example given and may be 16 bits as a practical matter).

The next entry ST. DPL gives the offset to the start of DPL, i.e. the address indicated as LBASE in FIG. 15. The remainder of VL consists of offsets relative to LBASE, namely ST. SPL, which is the start of SPL and is equal to zero, followed by ST. RPL1, ST. RPL2, etc and terminating with ST. SPL=0 again. SPL starts at LBASE with the data for module M at DPL address zero, i.e. address relative to LBASE.

When it is desired to access a given module, the corresponding DPL entry is accessed and action is taken as follows in dependence upon the R and U bits in the entry:

| R | U | |
|---|---|---|
| 0 | 0 | Address the module for read or write |
| 0 | 1 | Skip the module: no memory present |
| 1 | 1 | Spur module but no memory present: skip |
| 1 | 0 | Access SRPL, then address the module for read or write |

The contents of the PROM for the example of FIG. 14 can be tabulated as follows:

TABLE 1

| | | | | |
|---|---|---|---|---|
| | CHK.SUM | | | |
| | ST.DPL = 6 | | | |
| | ST.SPL = 0 | | | |
| | ST.RPL1 = 16 | | VL | |
| | ST.RPL2 = 22 | | | |
| | ST.RPL3 = 28 | | | |

| | MODULE NO. M | DISTANCE F | EXIT DIRN D | ON SPIRAL? R | |
|---|---|---|---|---|---|
| LBASE | 0 | 0 | 2 | 0 | |
| | 1 | 1 | 2 | 0 | |
| | 2 | 2 | 3 | 0 | |
| | 3 | 3 | 2 | 0 | |
| | 4 | 4 | 3 | 0 | |
| | 5 | 5 | 3 | 0 | |
| | 6 | 6 | 2 | 0 | |
| | 7 | 7 | 1 | 0 | |
| | 8 | 8 | 1 | 0 | |
| | 9 | 9 | 1 | 0 | |
| | 10 | 10 | 1 | 0 | |
| | 11 | 11 | 4 | 0 | |
| | 12 | 12 | 4 | 0 | |
| | 13 | 13 | 4 | 0 | |
| | 14 | 14 | 4 | 0 | |
| | 15 | 15 | 0 | 0 | |
| LBASE + 16 | 16 | 1 | 3 | 1 | |
| | 17 | 2 | 3 | 1 | |
| | 18 | 3 | 0 | 1 | RPL1 |
| | 19 | 7 | 0 | 1 | |
| | 20 | 11 | 0 | 1 | |
| | 21 | 3 | 0 | 1 | |
| LBASE + 22 | 16 | 0 | 3 | 0 | |
| | 17 | 0 | 3 | 0 | |
| | 18 | 0 | 3 | 0 | RPL2 |
| | 19 | 6 | 4 | 0 | |
| | 20 | 10 | 4 | 0 | |
| | 21 | 0 | 3 | 1 | |

TABLE 1-continued

| LBASE + 28 | 21 | 2 | 3 | 0 | RPL3 |
|---|---|---|---|---|---|

It should be noted that the PROM entries do not include the M numbers. They are given in Table 1 for convenience of understanding. The PROM entries store the values in the F, D and R columns, plus the U bit which is not shown in the Table.

Having regard to the foregoing description of FIGS. 10 to 12 it will be apparent how a module in the main spiral is accessed. The M number is used to access the PROM to fetch the F and D data. The F value is and used to determine DISPLACEMENT DATA (FIG. 11). CMDN DATA is determined by whether the access is to READ or WRITE. After the required read or write operation has been completed, the same DISPLACEMENT DATA with CMND DATA determined by the D value from the PROM are used to restore the spiral.

The operations to access a spur module are more complex but briefly, when R=1, the F and D values are stored and RPL2 is accessed to ascertain the F number to the relevant focal module which is then switched to the direction specified by D in the RPL2 list. If R in this list is zero, the stored F and D values are retrieved to access the module for READ or WRITE and subsequent restoration of its exit connection. If R is one, it is necessary to move on to RPL2 before effecting the access.

Figure 16:
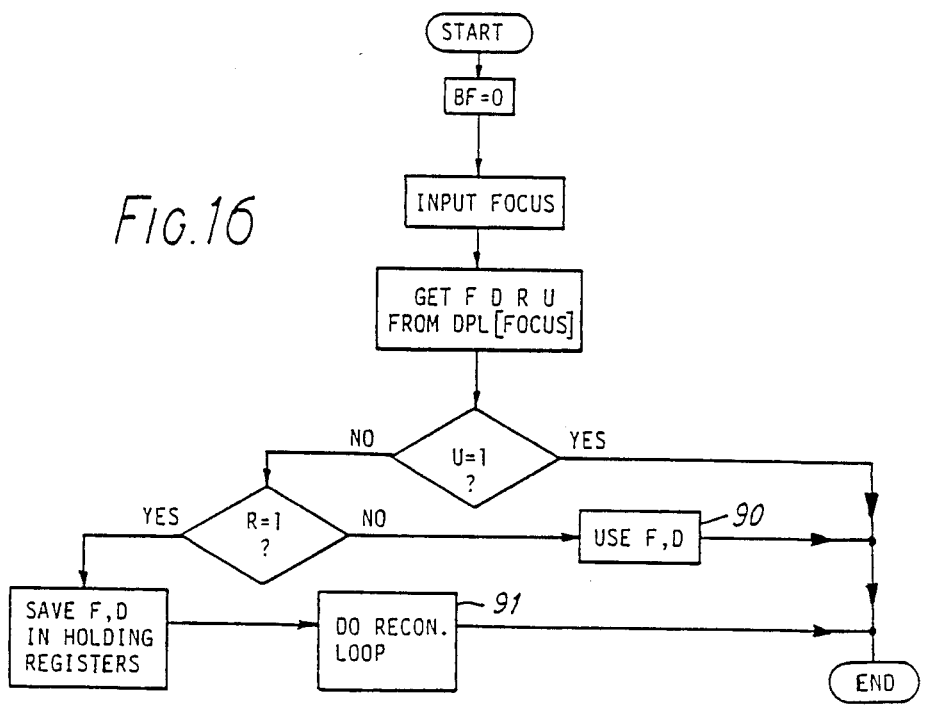
Figure 17:
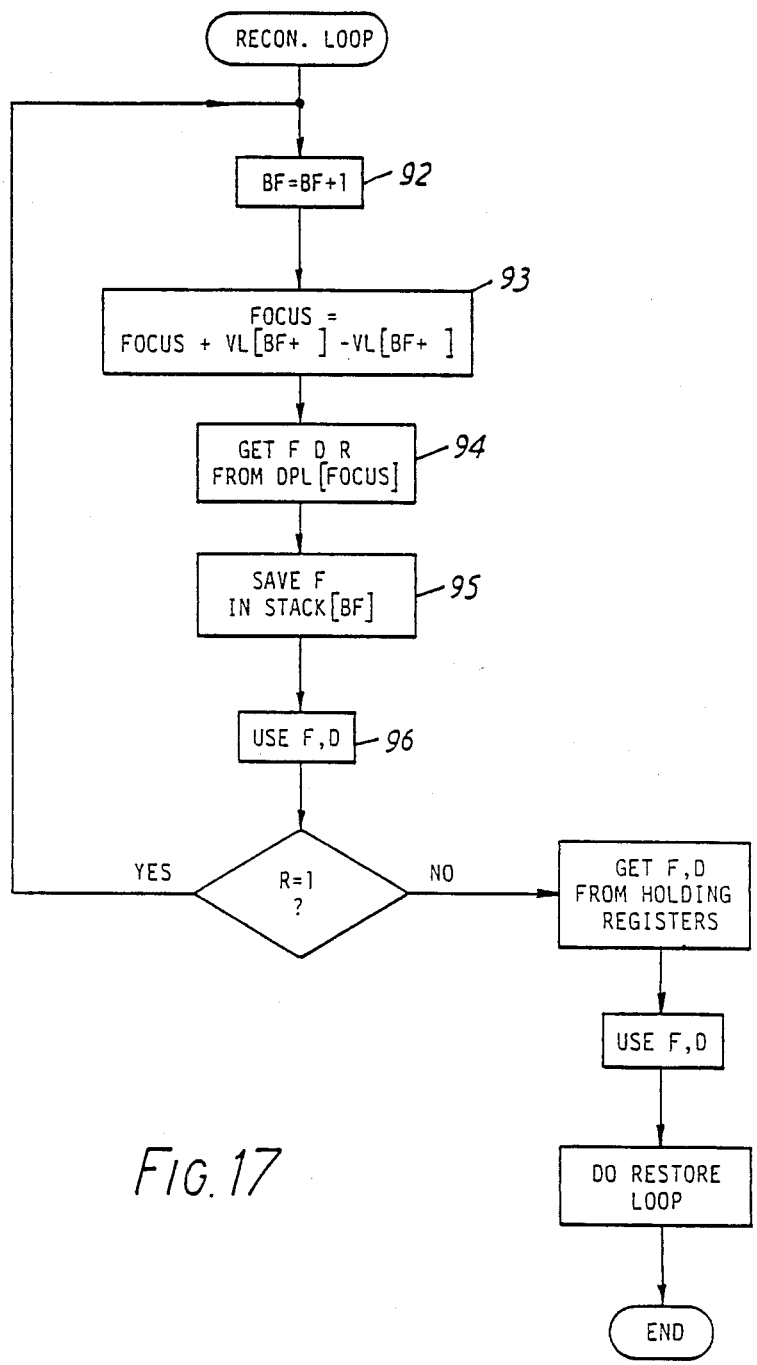
Figure 18:
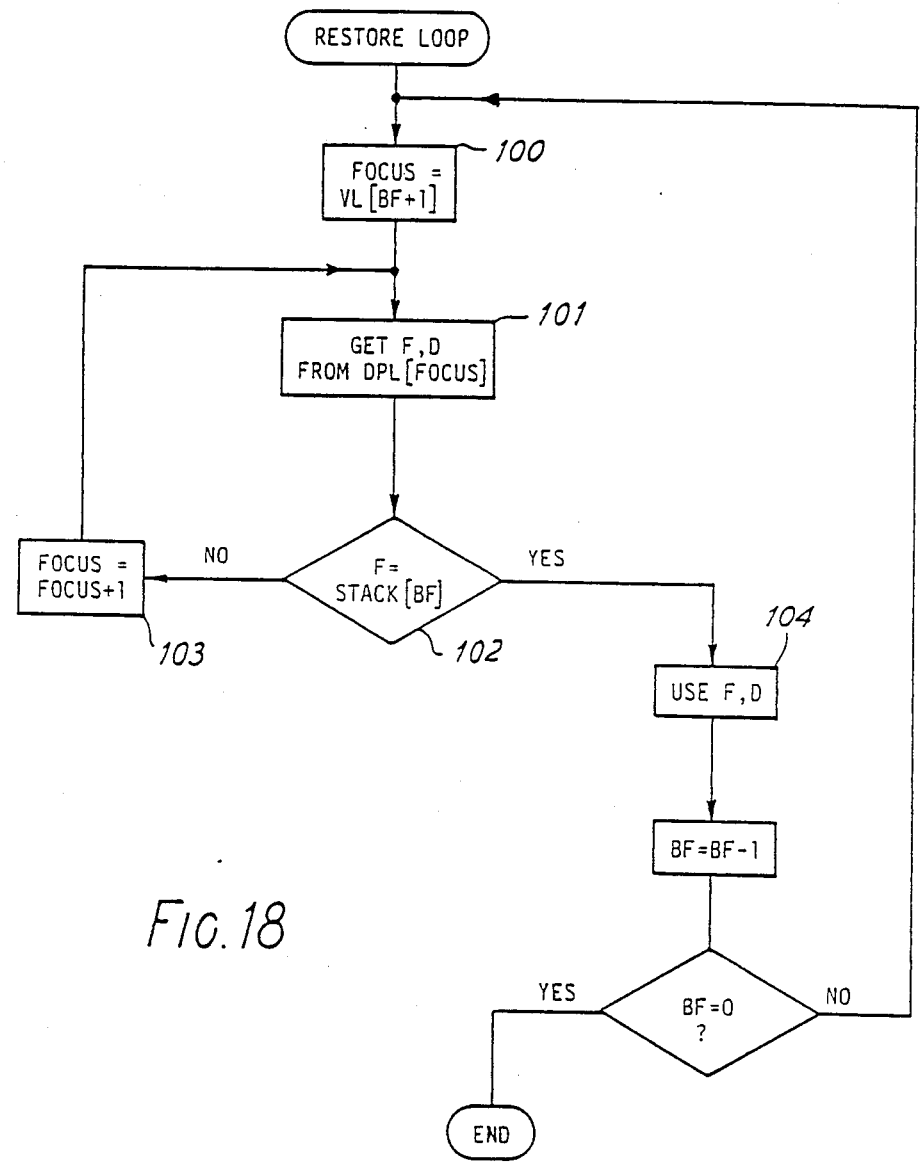

The accessing algorithms are given fully in FIGS. 16 to 18. FOCUS is used to identify the module currently treated by the algorithm: FIG. 16 shows the main algorithm and it is necessary to comment only on some blocks. The block 90 USE F, D is shorthand for the operations of using F to access the module for READ or WRITE and then using F and D to restore the normal exit connection of the module. The restoration operation is omitted if D=0. If R=1 it will be seen that F and D are saved and a RECONFIGURATION LOOP 91 is performed. The algorithm for this is shown in FIG. 17.

After incrementing BF in block 92 in FIG. 17 a new value for FOCUS is calculated in block 93. The principle can be explained for the case BF=1. If the number of the module is N, its number in RPL1 will be N-ST.RPL1 and its number in RPL2 will be the same. Hence its address, relative to BASE will be

ST.RPL2+N−ST.RPL1

ST.RPL2=VL[4]=VL[BF+3] and
ST.RPL1=VL[3]=VL[BF+2]

This translates to the general algorithm

FOCUS=FOCUS+VL[BF+3]−VL[BF+2]

In block 94 the F, D and R values for the nodal module are obtained and F is saved (block 95) for use when restoring the normal configuration. The block 96 USE F,D here means use the F and D values obtained in block 94 to switch the nodal module to the exit direction specified by D, in order to connect into the spur. The operations 92 to 96 are repeated to the required depth, until R=0, to cater for the existence of spurs from spurs. Once R=0, the route to the original FOCUS module is complete. This is accessed by getting its F and D numbers from the holding registers (block 97) and then performing block 98 which is the same as block 90 in FIG. 1. It is finally necessary to perform a restore loop (block 99) in oreder to restore the normal configuration. This loop is shown in FIG. 18.

Before describing FIG. 18 it will helpful to explain what is needed to restore configuration in the case when BF=2. The corresponding number on the stack identifies the focal module which was last switched in routing to the spur. This module has to be switched to its normal exit direction, which is given in RPL1 and can be found by searching from the beginning of RPL1 until F matches the stack number. In the example of FIG. 14 and Table 1, this can only be 2 (only module 21 has BF=2). If RPL1 is searched a match is obtained when the module 17 is reached with F=2 and D=3. Accordingly this module must be switched back to SELS. The next number on the stack identifies the focal module which was switched when BF=1. This module has to be switched to its normal exit direction, which is given in SPL1 and can be found by searching from the beginning of SPL1 until F matches the stack number.

In the algorithm of FIG. 18, therefore, the first operation 100 is to be set FOCUS=VL [BF+1] which identifies the correct block in the PROM. Next a search loop proceeds in blocks 101, 102, 103 through successive entires in the block, until F=STACK [BF]. Then F and D are used (block) 104 to restore the normal exit direction, BF is decremented (105) and, if BF is not zero, the restore loop is repeated.

In order that the algorithms of FIGS. 16 to 18 shall opeate correctly it is necessary to assign the module numbers M systematically. The various possible spirals are grown and then the numbers are assigned as follows:

The numbering starts sequentially from 0 to A through the main spiral. The spurs with BF=1 are then sorted by length, the modules of the longest are numbered A+1 to B, the modules of the next spur are numbered B+1 to C and so on. For the purposes of the sort, length may be given by the number of modules in the spur but is preferably given by the number of modules with functioning memory. The distinction between moduels in a chain with and without functioning memory is explained in our prior application. A, B, C are merely the numbers reached at the ends of the main spiral and spurs. If there are modules of equal lengths, they are treated in order to closeness to XMIT. Next the spurs with BF=2 are treated in like manner, and so on. The allocation of M numbers in FIG. 14 will be seen to comply with these rules.

The hardware for implementing the algorithms of FIGS. 16 to 18 is not described. It is apparent that the algorithms are elementary and can readily be implemented by suitably programming a microprocessor.

Table 2 shows the start of PROM contents required for the embodiment of FIG. 7. The Table starts with a vector list consisting of CHK. SUM followed by offsets ST. Ml etc pointing to the entries for M1, M2 etc. Each such entry is a list of the directions required to reach the module, terminating with direction 0, accompanied by the value of L indicating the number of steps required in the given direction. The value of L associated with D=0 is given as 1 although it is immaterial.

TABLE 2

| | ADDRESS | | |
|---|---|---|---|
| | 0 | CHK. SUM | |
| | 1 | ST. M1 = 20 | |
| | 2 | ST. M2 = 21 | |
| | . | | |
| | . | | |
| | . | | |
| | 19 | ST. M19 = 71 | |
| | | D | L |
| M1 | 20 | 0 | 0 |
| M2 | 21 | 1 | 1 |
| | 22 | 0 | 1 |
| M3 | 23 | 1 | 2 |
| | 24 | 0 | 1 |
| M4 | 25 | 1 | 3 |
| | 26 | 0 | 1 |
| M5 | 27 | 1 | 4 |
| | 28 | 0 | 1 |
| M6 | 29 | 1 | 4 |
| | 30 | 2 | 1 |
| | 31 | 0 | 1 |
| M7 | 32 | 1 | 4 |
| | 33 | 2 | 2 |
| | 34 | 0 | 1 |
| M8 | 35 | 1 | 4 |
| | 36 | 2 | 3 |
| | 37 | 0 | 1 |
| . | . | . | . |
| . | . | . | . |
| . | . | . | . |
| M18 | 67 | 1 | 2 |
| | 68 | 2 | 3 |
| | 69 | 3 | 1 |
| | 70 | 0 | 1 |
| M19 | 71 | 1 | 2 |
| | 72 | 2 | 3 |
| | 73 | 3 | 2 |
| | 74 | 0 | 1 |

Figure 19:
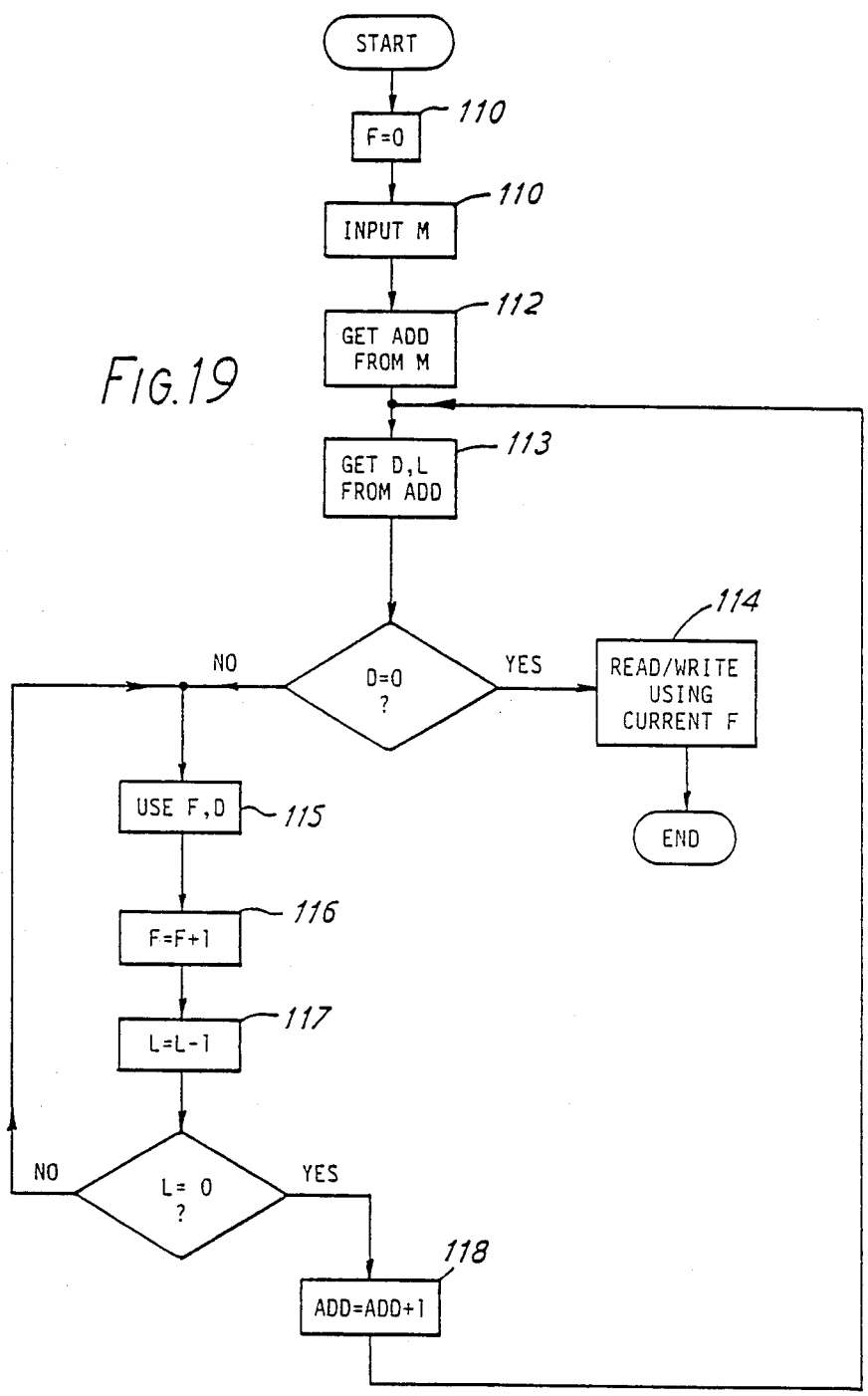

FIG. 19 shows the access algorithm. It is immaterial what connections are left in existence at the conclusion of an access as all connections are set up afresh each time a different module is accessed. There is therefore no restore routine. With referencee to blocks 110 and 111, F is again the distance in clock pulses to a module and M is the selected module number. In block 112, the address ADD for the entries pertaining to module M is obtained from location M in the vector list and in block 113, the initial values of D and L are obtained from ADD. D is tested to see if the end of the path to the selected module has been reached (D=0). If so the current value of F may be employed (block 114) to effect as many read or write accesses as required. If D is not zero, the current values of F and D must be used (block 115) to cause the module to connect to the next module. F is then incremented (block 116), L is decremented (block 117) and a test is made to see whether L=0. If not the algorithm loops back to block 115 to move on in the same direction D to the next module. When L=0, ADD is incremented (block 118) and the algorithm loops back to block 113.

Although block 115 could be implemented by sending a fresh token bit down the chain each time, this would make the growth slow. It is therefore preferable to hand the token bit on from module to module which requires DISPLACEMENT DATA to be set always to 1 (FIG. 11) while CMND DATA will be set to whatever is required by the value of D. When this is done, it is possible to achieve a performance advantage over the technique of FIGS. 6 and 13 to 18 which will now be called the first algorithm; FIG. 19 represents the second algorithm. If, using the first algorithm, the main spiral has a length of A modules, and if the configuration logic is as described herein, the time taken to command the last module in the main spiral and restore it to its normal state is 2A+11 clock cycles. The time taken to address modules in spurs is greater, because of the need to switch nodal modules. As an example, to address a single spur branching from the last module in the main spiral would require 3A+13 clock cycles.

If the second algorithm is used, the worst case value of A is reduced. Consider a prefect 16×16 array of modules. Using the first algorithm, the spiral would be 256 modules long and the addressing overhead of the first algorithm would be 512+11 clock cycles. Under the second algorithm, the worst cases arises when addressing a module diagonally opposite the bondsite. If the path had to be built by launching a fresh token bit for every command, the number of clock cycles to address a diagonally opposite module would be 528 plus 314*4+7=659 clock cycles, a deterioration relative to the first algorithm. However, if the token bit is passed from module to module, the worst case overhead becomes 31*5+7=162 clock cycles.

In order to benefit from this reduction in number of clock cycles, the controller has to be able to issue commands in sufficiently rapid succession. The minimum interval is only 5 clock cycles and it is unlikely that a microprocessor accessing the PROM could achieve adequate speed. A solution to this problem is to use a FIFO buffer deep enough to store the longest possible sequence of D values to be used in establishing the correct sequence of CMND durations. The filling of the FIFO buffer becomes part of the address overhead. Using a typical 16 bit microprocessor such as the 68008, the worst case would require transferring 32 nibbles from the PROM to the FIFO buffer, at approximately 4 us per byte, amounting to 64 us (i.e. 16 bytes at two nibbles per byte) for the above example of a 16×16 array. The overhead could be reduced by overlapping the writing of the FIFO buffer for the next access with reading the buffer for the current access.

The FIFO buffer and the control circuit of FIG. 11 could be implemented on the water, at the bondsite. This would increase the number of pins to be connected to the wafer.

Under the above conditions, if the clock frequency is 2 MHz, the second algorithm gives a worst case access time of 145+16 us, compared with 256+4 us for the first algorithm. However if the clock frequency is higher, the first algorithm becomes more efficient. At 20 MHz, the scond algorithm results in 74 us and the first algorithm in 30 us. The cross-over between the two algorithms occurs at about 5.3 MHz.

Another advantage of the first algorithm ever the second is that the PROM table is compact because redundant commands pertaining to the main spiral are eliminated. Moreover the table size is surprisingly constant for different yields. The following table pertains to a wafer with about 300 modules. YC is the percentage yield of modules usable in a chain but not necessarily hving usable RAM. YM is the percentage yield of modules usable in the chain and having usable RAM.

| | | | List Length (bytes) | | | |
|---|---|---|---|---|---|---|
| YC | YM | Average BF | DPL | SRPL | VL | Total |
| 60 | 30 | 6 | 76 | 994 | 32 | 1102 |
| 90 | 50 | 2 | 1024 | 168 | 32 | 1224 |
| 99 | 80 | 1 | 1212 | 36 | 32 | 2280 |

In the second algorithm there is no preferred path to restore and there is therefore a large redundant overhead in the PROM table data. Consider a perfect array, say 16*16 modules. The first algorithm requires only 256 entries for the DPL and SPRL whereas the second algorithm requires a total of commands given by

```
           sum of 1 to 32
       plus sum of 1 to 31
       plus sum of 1 to 30
               .    .
               .    .
               .    .
       plus sum of 1 to 16
``` which is 5304. However the PROM list can be shortened by the technique illustrated in FIG. 2 above, where data compression is effected by commands giving a D (direction) value plus an L (length value specifying the number of steps in the given direction. For very many modules, only three entries will berequired - two different D, L pairs and a terminating entry with D=0.

The algorithms for determining the growth patterns for the two algorithms are not considerd here in detail. As to the first algorithm it is apparent that the known spiral algorithm, described above, can be used, supplemented by keeping a record of the orphan modules in spurs. Modules numbers can then be assigned to these in accordance with the rules set forth above and the contents for the PROM can be computed. It is apparent that the algorithms required can be fully automated although it is also apparent that a human operator could take the necessary decisions on the basis of information acquired during growth of the main spiral.

The growth process for the second algorithm can readily be automated by requiring the controller to attempt to reach the target module utilising only preferred selection directions with adoption of alternative directions only when this is forced. Unless the wafer is badly flawed it will almost always be possible to cross an array of modules diagonally solely by stepping in two orthogonal directions only, never in the reverse directions (although FIG. 7 shows use of a reverse direction to reach M(2, 4) and M(1,4)).

The basic growth algorithm used in the embodiment described above is the algorithm disclosed in GB No. 1 377 859 whereby the first option is always a predetermined direction (N in the example of FIG. 4). Another possiblity is to make the first option the same direction as was used to enter the module from which growth is being effected. Yet another possibility is to make the first option the next direction on from the direction used to enter the module from which growth is being effected. An example of this possibility is described in our copending British application No. 8524046, published as GB No. 2,181,280.

I claim:

1. A circuit module system comprising a command unit, an assembly of circuit modules connectable in a chain, each module comprising a function unit for receiving data from and sending data to said command unit via other intervening modules in the chain, each module further comprising a control unit responsive to commands sent to that module by said command unit via other intervening modules in the chain, said control unit including configuration logic responsive to certain of said commands for selecting one of a plurality of neighbouring modules as the next module in said chain, said command unit including a store storing a plurality of sequences of said certain commands, each said sequence defining a unique chain of modules and the chains corresponding to said sequences terminating at different ones of said modules, and wherein said command unit is operative when accessing said function unit of a selected module to select one of said sequences of commands defining a chain which includes said selected module and to issue the commands of said selected sequence to build the chain of modules to said selected module.

2. A system according to claim 1, wherein the modules are an array of integrated circuits on a wafer.

3. A system according to claim 1, wherein each module can connect to only one next module at a time.

4. A system according to claim 1, wherein the stored sequences of commands comprise command establishing a datum selection for each module and alternative selections for nodal modules whereat chains branch.

5. A system according to claim 4, wherein the command unit is arranged, following any access to a module, to restore the datum selections of that module and any nodal module switched to an alternative selection in effecting the access, whereby the assembly of modules is restored to a datum state with a main one of the plurality of chains set up.

6. A system according to claim 5, wherein the main chain is the longest chain.

7. A system according to claim 5, wherein the stored sequences of commands comprise a first list of the datum selections for all the modules, each accompanied by a flag indicating whether the module is in the main chain or not, and at least one further list giving the alternative selections for modules flagged in the first list as not in the main chain.

8. A system according to claim 7, wherein there is a heirarchy of further lists wherein the alternative selections are flagged to indicate whether or not access to a module involves recourse to the next list in the heirarchy.

9. A system according to claim 1, wherein the stored sequences of commands comprise lists individual to the modules specifying the sequences of selections required to access each module.

10. A system according to claim 9, wherein each list includes a number of entires consisting of a selection specifier accompanied by a number indicating the number of times that selection is to be made.

11. A system according to claim 9, wherein each sequence of selections specifies a shortest access route available to its module.

* * * * *